(12) United States Patent
Son et al.

(10) Patent No.: US 8,101,509 B2
(45) Date of Patent: Jan. 24, 2012

(54) SEMICONDUCTOR INTEGRATED CIRCUIT DEVICE

(75) Inventors: Yong-hoon Son, Yongin-si (KR);
Si-young Choi, Seongnam-si (KR);
Jong-wook Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/025,011

(22) Filed: Feb. 10, 2011

(65) Prior Publication Data

US 2011/0127530 A1 Jun. 2, 2011

Related U.S. Application Data

(62) Division of application No. 12/073,315, filed on Mar. 4, 2008, now Pat. No. 7,888,246.

(30) Foreign Application Priority Data

Mar. 5, 2007 (KR) ........................ 10-2007-0021377

(51) Int. Cl.
*H01L 21/20* (2006.01)
(52) U.S. Cl. .......... 438/486; 438/268; 438/283; 257/57; 257/66; 257/283; 257/365; 257/E21.421; 257/E29.003; 257/E29.264
(58) Field of Classification Search .................. None
See application file for complete search history.

(56) References Cited

U.S. PATENT DOCUMENTS

| 6,838,322 B2 * | 1/2005 | Pham et al. ................... 438/151 |
| 7,087,506 B2 | 8/2006 | Anderson et al. |
| 2005/0077553 A1 | 4/2005 | Kim et al. |
| 2006/0180854 A1 | 8/2006 | Hsu et al. |
| 2008/0038889 A1 | 2/2008 | Cho et al. |

FOREIGN PATENT DOCUMENTS

| KR | 10-2003-0065864 A | 8/2003 |
| KR | 10-2004-0050405 A | 6/2004 |
| KR | 10-2005-0035712 A | 4/2005 |
| KR | 10-2005-0102465 A | 10/2005 |

* cited by examiner

*Primary Examiner* — Charles Garber
*Assistant Examiner* — Yasser Abdelaziez
(74) *Attorney, Agent, or Firm* — Lee & Morse, P.C.

(57) ABSTRACT

A method of fabricating a semiconductor integrated circuit includes forming a first dielectric layer on a semiconductor substrate, patterning the first dielectric layer to form a first patterned dielectric layer, forming a non-single crystal seed layer on the first patterned dielectric layer, removing a portion of the seed layer to form a patterned seed layer, forming a second dielectric layer on the first patterned dielectric layer and the patterned seed layer, removing portions of the second dielectric layer to form a second patterned dielectric layer, irradiating the patterned seed layer to single-crystallize the patterned seed layer, removing portions of the first patterned dielectric layer and the second patterned dielectric layer such that the single-crystallized seed layer protrudes in the vertical direction with respect to the first and/or the second patterned dielectric layer, and forming a gate electrode in contact with the single-crystal active pattern.

5 Claims, 5 Drawing Sheets

SEMICONDUCTOR INTEGRATED CIRCUIT DEVICE

CROSS REFERENCE TO RELATED APPLICATION

This is a divisional application based on application Ser. No. 12/073,315, filed Mar. 4, 2008 now U.S. Pat. No. 7,888,246, the entire contents of which is hereby incorporated by reference.

BACKGROUND OF THE INVENTION

1. Field of the Invention

Embodiments relate to a semiconductor integrated circuit device and a method of fabricating the same. More particularly, the present invention relates to a semiconductor integrated circuit device including a finned field effect transistor (Fin-FET) and a manufacturing method thereof.

2. Description of the Related Art

As the integration density of semiconductor devices such as field effect transistors (FET) is increased, the gate electrode line width in these semiconductor devices is decreased, and the channel length and width is decreased. Such a channel length decrease can cause a short channel effect (SCE) such as drain induced barrier lowering (DIBL) and punch-through as well as narrow width effect which increases the transistor threshold voltage.

To overcome these undesired effects, a Fin-FET having an increased contact area between the substrate and the gate electrode has been developed. The Fin-FET includes a protruding silicon fin, and a gate electrode covering both the sides and the top of the silicon fin to form a channel. As a result of forming a channel on both sides and the top of the silicon fin, the channel width is increased. Additionally, as another result of forming a channel on both sides of the silicon fin, controllability of the gate electrode may be improved. Furthermore, current may be increased through the gate, as current may be able to flow through multiple sides of the channel in a Fin-FET such as described above.

Rapid increase in integration density, however, may result in undesired on/off characteristics of a resulting semiconductor device employing one or more Fin-FET configurations. Accordingly, there remains a need to develop a semiconductor integrated circuit device and a method of forming a semiconductor integrated circuit device that addresses at least some of these limitations.

SUMMARY OF THE INVENTION

Embodiments are therefore directed to a semiconductor integrated circuit device and a method of fabricating a semiconductor integrated circuit device, which may overcome one or more of the disadvantages of the related art.

It is therefore a feature of an embodiment of the present invention to provide a semiconductor integrated circuit device having a Fin-FET configuration that overcomes one or more of the disadvantages of the related art.

Another feature of an embodiment of the present invention is to provide a method of fabricating semiconductor integrated circuit device having a Fin-FET configuration.

At least one of the above and other features of the present invention may be realized by providing a method of fabricating a semiconductor device, the method including forming a first dielectric layer on a semiconductor substrate, patterning the first dielectric layer to form a first patterned dielectric layer, forming a non-single crystal seed layer on the first patterned dielectric layer, removing a portion of the seed layer to form a patterned seed layer, forming a second dielectric layer on the first patterned dielectric layer and the patterned seed layer, removing portions of the second dielectric layer to form a second patterned dielectric layer, irradiating the patterned seed layer to single-crystallize the patterned seed layer, removing portions of the first patterned dielectric layer and the second patterned dielectric layer such that the single-crystallized seed layer protrudes in the vertical direction with respect to the first and/or the second patterned dielectric layer, and forming a gate electrode in contact with the single-crystallized seed layer.

The first patterned dielectric layer may be formed to expose a predetermined region of the semiconductor substrate. The non-single crystal seed layer may be formed on a sidewall of the first dielectric layer pattern. The second patterned dielectric layer may be formed on at least a portion of the predetermined region of the semiconductor substrate in contact with the non-single crystal seed layer.

The first patterned dielectric layer may be formed to include patterns on the first patterned dielectric layer that include open regions which expose the predetermined region of the semiconductor substrate, such as line and space patterns.

The first patterned dielectric layer and the second patterned dielectric layer may be formed of silicon oxide.

The single-crystallized seed layer may be formed by forming the non-single crystal seed layer on the first patterned dielectric layer and anisotropically etching the non-single crystal seed layer to form the spacer-shaped single-crystallized seed layer on the sidewall of the first patterned dielectric layer. The non-single crystal seed layer may be formed with a thin film including silicon, germanium, or compounds thereof For example, the non-single crystal seed layer may be formed with an amorphous silicon layer or a polysilicon layer. Furthermore, the thickness of the non-single crystal seed layer may be about 2 nm to about 20 nm. The single-crystallized seed layer may be formed to have a closed curve shape or a line shape.

The second patterned dielectric layer may be formed on the first patterned dielectric layer and the patterned seed layer, and may be planarized to expose a top surface of the patterned seed layer.

Single-crystallizing the patterned seed layer patterns may include irradiating the patterned seed layer by employing a laser beam such that the patterned seed layer enters the liquid phase, and may further include heating the semiconductor substrate to a temperature in the range of about 200° C. to about 600° C. at some time during the irradiation of the patterned seed layer.

A gate dielectric layer may be formed on the surface of the single-crystallized seed layer prior to forming the gate electrode. The gate dielectric layer may include a silicon oxide layer, a silicon nitride layer, a silicon oxynitride layer, and a high-k layer, or a combination thereof. For example, the gate electrode may include polysilicon, metal, metal nitride, or conductive metal oxide, or a multilayer formed of a combination thereof.

At least one other of the above and other features and advantages of the present invention may be realized by providing a semiconductor integrated circuit device including a semiconductor substrate having a top surface and a bottom surface, a single-crystal seed layer protruding from the top surface of the semiconductor substrate, a gate dielectric layer formed on both sides and top of the single-crystal seed layer, and a gate electrode formed on the single-crystal seed layer and the gate dielectric layer.

The semiconductor integrated circuit device may include a single-crystal seed layer comprised of silicon, germanium, or compounds thereof. For example, the single-crystal seed layer may be an amorphous silicon layer or a polysilicon layer. The single-crystal seed layer may have a closed curve shape or a line shape.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
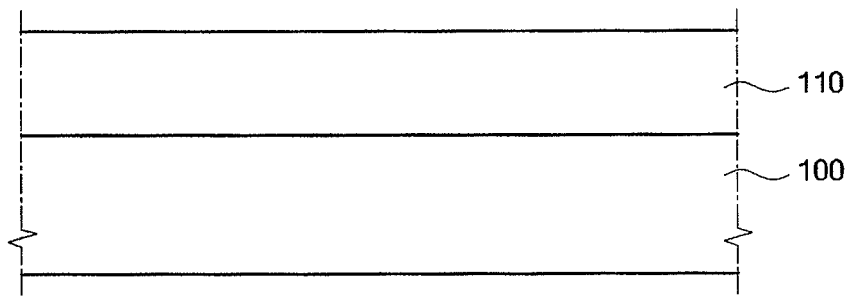
FIGS. 1 through 9 illustrate sectional views of fabrication stages of a semiconductor integrated circuit device according to an embodiment of the present invention.

Korean Patent Application No. 10-2007-0021377 filed on Mar. 5, 2007, in the Korean Intellectual Property Office, and entitled: "Method of Fabricating a Semiconductor Integrated Circuit Device and a Semiconductor Integrated Circuit Device Fabricated Thereby," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Embodiments of the present invention may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification. Furthermore, terminology employed herein is intended to explain embodiments of the present invention. However, it is worthwhile to note that the scope of the present invention is not limited by the terminology employed herein.

Additionally, the shape of elements of the accompanying figures may vary due to manufacturing technologies and/or allowable errors. For example, etch regions illustrated as having right angles may have a round shape or a curved shape. Therefore, regions shown in the figures are illustrated in schematic forms, and the shapes of the illustrated regions in the figures are presented simply by way of illustration and not as a limitation.

Hereinafter, referring to FIGS. 1 through 11, a semiconductor integrated circuit device such as a non-volatile memory device, as well as a method of fabrication according to exemplary embodiments of the present invention is described in detail.

Figure 10:
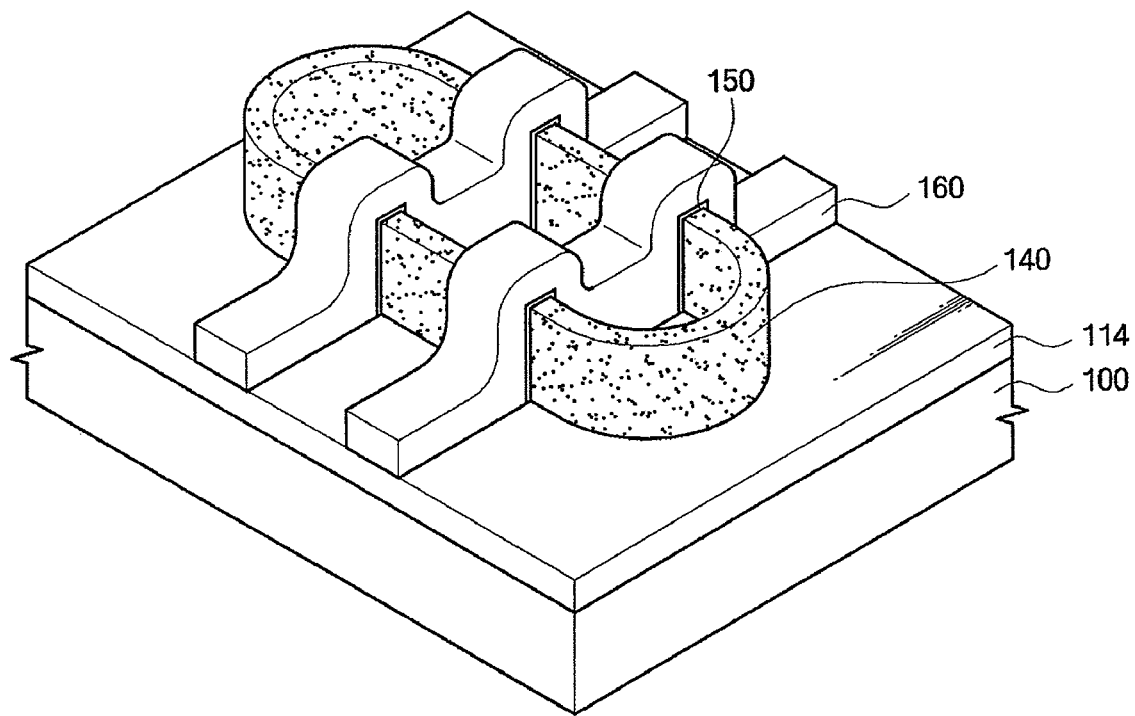
FIG. 10 illustrates a perspective view of a semiconductor integrated circuit device according to an embodiment of the present invention.
Figure 11:
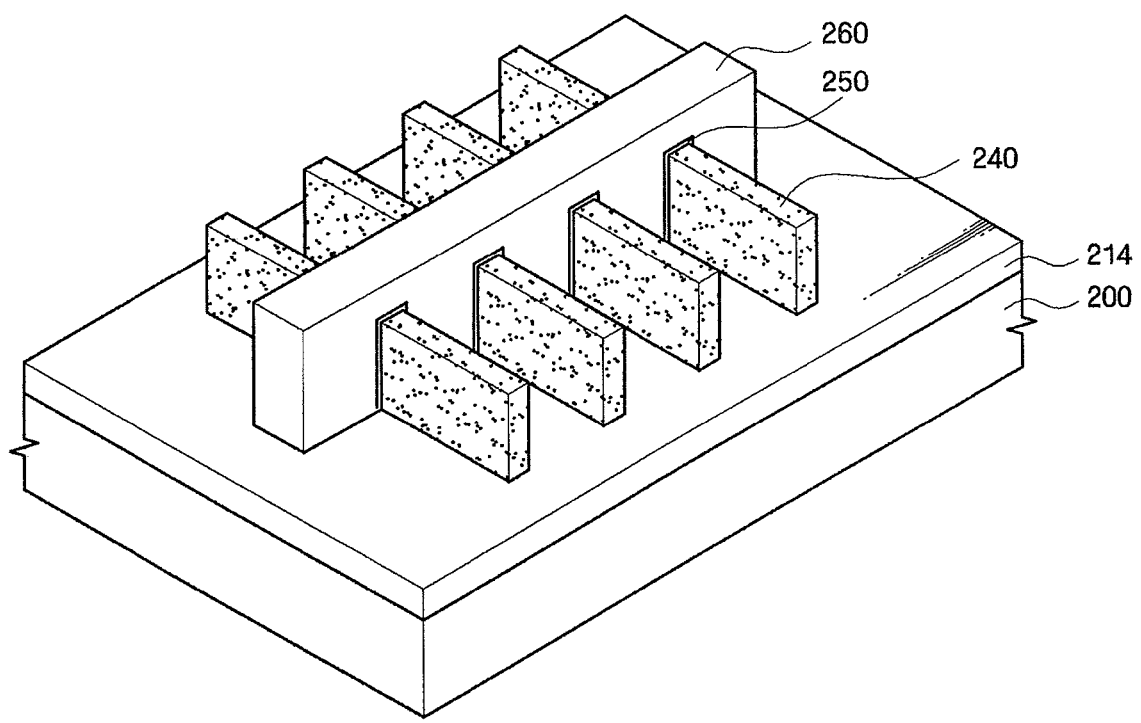
FIG. 11 illustrates a perspective view of a semiconductor integrated circuit device according to another embodiment of the present invention.

FIGS. 1 through 9 illustrate sectional views of fabrication stages of a semiconductor integrated circuit device according to an embodiment of the present invention. FIG. 10 illustrates a perspective view of a semiconductor integrated circuit device fabricated in accordance with an embodiment, and FIG. 11 is a perspective view illustrating a semiconductor integrated circuit device fabricated in accordance with another embodiment.

FIG. 1 illustrates a semiconductor substrate 100. The semiconductor substrate 100 may be bulk silicon, bulk silicon-germanium, or a complex structure substrate including a silicon epitaxial layer or silicon-germanium epitaxial layer on bulk silicon or bulk silicon-germanium, as just a few examples, although the scope of the present invention is not so limited.

A first dielectric layer 110 is formed to a thickness on the semiconductor substrate 100. For example, the first dielectric layer 110 may be formed of a silicon oxide such as BPSG (Borophosphosilicate Glass), PE-TEOS (Plasma Enhanced Tetraethylorthosilicate), and HDP (High Density Plasma), as just a few examples, although again, the scope of the present invention is not so limited. A height of a resulting multi-fin in a multi-Fin-FET may be determined by adjusting the thickness of the first dielectric layer 110. Additionally, although not illustrated, depending on the type of transistor that may be formed from the semiconductor substrate 100 and the first dielectric layer 110, a well may be formed in the first dielectric layer 110 in at least one embodiment.

Figure 2:
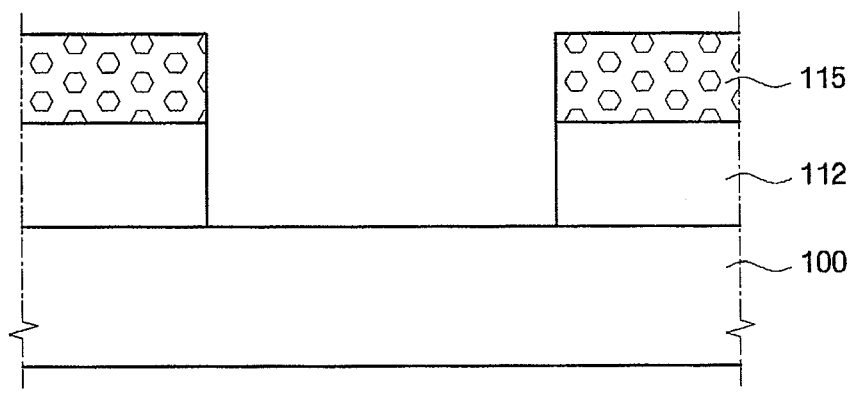

As illustrated in FIG. 2, after the first dielectric layer 110 is formed on the semiconductor substrate 100 in FIG. 1, a mask pattern 115 may be formed on the first dielectric layer 110 to expose areas of the dielectric layer to be removed. The mask pattern 115 may additionally mask an area where a pattern may be formed on the silicon substrate 110. Although not illustrated in detail, the mask pattern 115 may be employed to enable removal of portions of dielectric layer 110 and to enable formation of a patterned dielectric layer 112 from first dielectric layer 110. For example, portions of dielectric layer 110 may be removed via one or more etching processes to etch the first dielectric layer 110 until the semiconductor substrate 100 is exposed, although the scope of the present invention is not so limited and other removal processes may be employed in alternate embodiments. Furthermore, the first dielectric layer pattern 112 is not limited to any particular pattern, and may vary depending on a desired shape of single-crystallized seed layer patterns 140 (not shown), as will be explained in more detail with reference to FIG. 7. For example, the first dielectric layer pattern 112 may be a pattern including open regions which expose predetermined areas of the semiconductor substrate 100 or may be a pattern including lines and voids formed between the lines, as will be explained in greater detail later.

Figure 3:
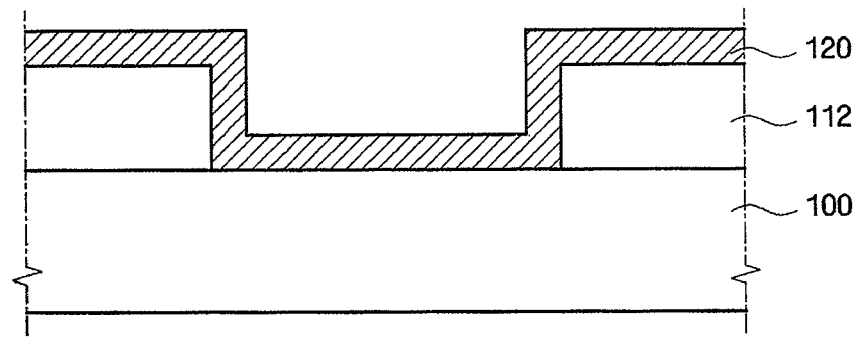

In FIG. 3, the mask pattern 115 (see FIG. 2) formed on the first dielectric layer pattern 112 may be removed, and a seed layer 120 may be formed on one or more exposed surfaces of the first dielectric layer pattern 112 and/or the semiconductor substrate 100. The seed layer 120 may be formed by deposition of non-single crystal materials such as an amorphous thin film and a polycrystalline thin film, and the seed layer 120 may be a thin film including silicon (Si), germanium (Ge), or compounds thereof, although the scope of the present invention is not so limited. Typically, amorphous silicon or a polysilicon may be used. The seed layer 120 may be formed by employing a chemical vapor deposition (CVD) process or an atomic layer deposition (ALD) process, and when formed, the seed layer 120 may be formed to a thickness of about 2 nm to about 20 nm.

Figure 4:
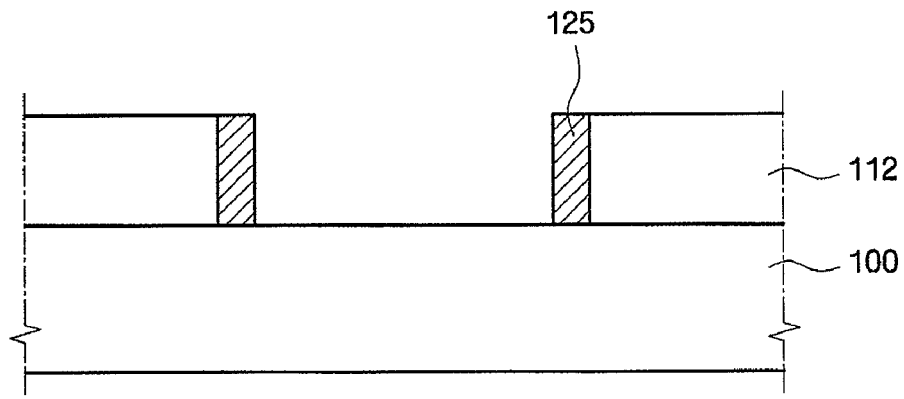

In FIG. 4, seed layer patterns 125 are formed on the side walls of the first dielectric layer pattern 112 by anisotropic etching the seed layer 120. In this embodiment, the seed layer patterns 125 are formed on the side walls of the first dielectric layer pattern 112 as a pair of spacers positioned opposite from one another. The seed layer patterns 125 may be formed to have a width, and the width of the seed layer patterns 125 may affect the resulting width of single-crystallized seed layer patterns 140, as will be explained in greater detail with reference to FIG. 7. Furthermore, although illustrated as a pair of equal and opposite spacers in this embodiment, it is worthwhile to note that the scope of the present invention is not so limited. For example, in alternative embodiments, the seed layer patterns 125 may be formed in various shapes and/or configurations, such as a closed curvilinear plane, e.g., a ring-shaped pattern or a line-shaped pattern, and may not be equal and/or opposite with respect to one another, for example.

Figure 5:
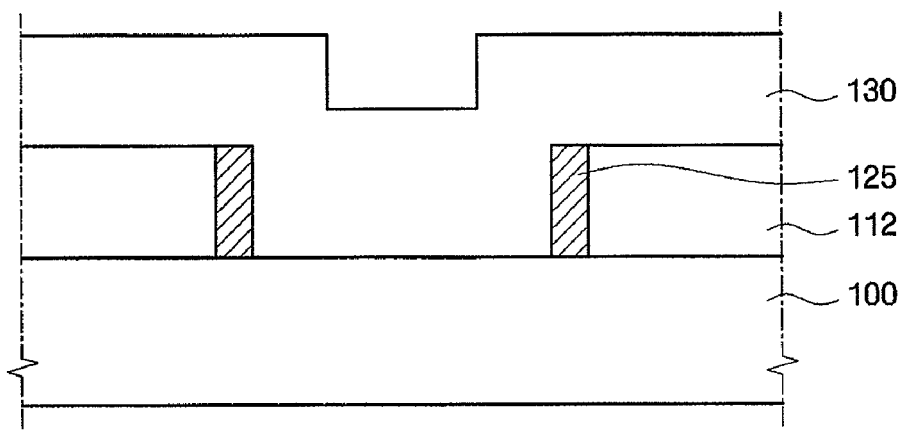
Figure 6:
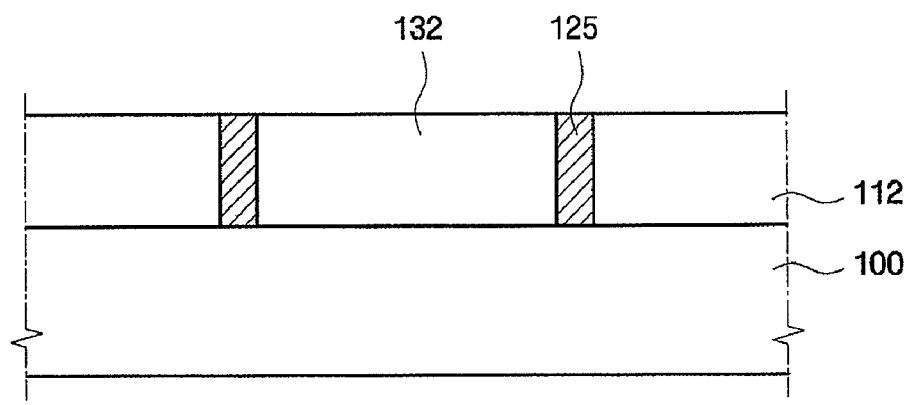

Referring to FIGS. 5 and 6, a second dielectric layer 130 may be formed on silicon substrate 100, and may fill in the space between the seed layer patterns 125. The second dielectric layer 130 may be formed of a silicon oxide layer such as HDP layer, or may be formed from the same material as the first dielectric layer 110, for example. After formation of the second dielectric layer 130 on silicon substrate 100, the second dielectric layer 130 may be planarized until a portion of one or more of the seed layer patterns 125 are exposed. For example, although the scope of the present invention is not so limited, the second dielectric layer 130 may be planarized to form the second patterned dielectric layer 132, such that the second patterned dielectric layer 132 is substantially planar with respect to the first patterned dielectric layer 112 and/or the seed layer patterns 125. After planarization, the patterned dielectric layer 132 may be formed between the seed layer patterns 125, as illustrated in FIG. 6.

Figure 7:
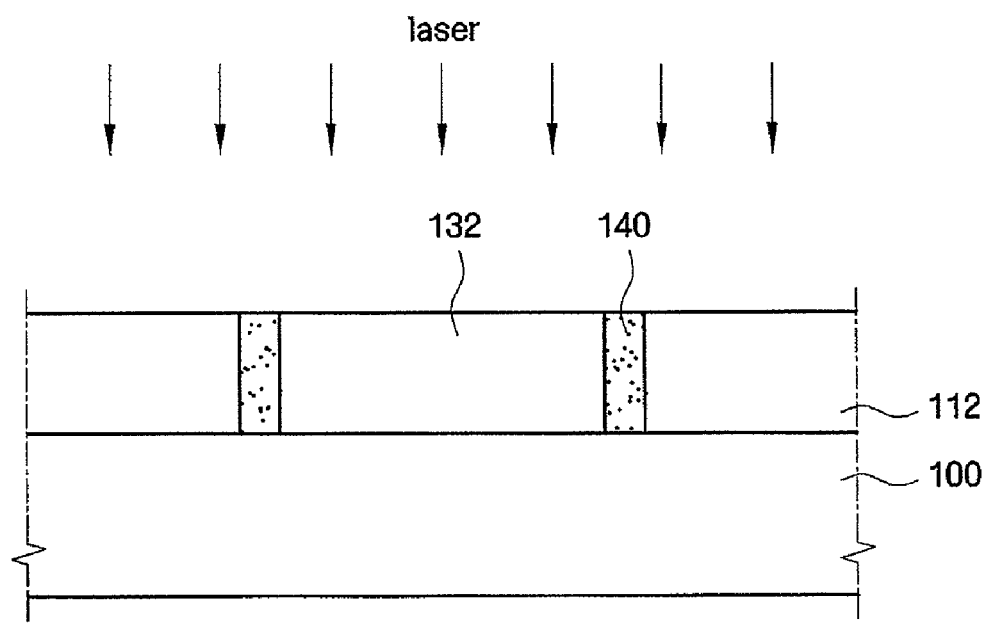

In FIG. 7, laser-induced epitaxial growth (LEG) may be performed on the seed layer patterns 125 illustrated in FIG. 6 to form single-crystallized seed layer patterns 140. For example, the exposed surfaces of the seed layer patterns 125 may be laser irradiated to single-crystallize the crystal structure of the seed layer pattern 125 to form single-crystallized seed layer patterns 140. In this embodiment, when laser beam irradiation is performed on the seed layer patterns 125, if the seed layer patterns 125 include amorphous thin film or polycrystalline thin film, the amorphous thin film or polycrystalline thin film may be melted to transform into a liquid phase. When the seed layer patterns 125 are transformed into the liquid phase, material such as silicon or germanium in the seed layer patterns 125 may function as a seed, such that epitaxial growth is initiated to single-crystallize the amorphous or polycrystal seed layer patterns 125 and form the single-crystallized seed layer patterns 140.

The laser irradiation process may typically be performed in several nanoseconds, as the laser beam has enough energy to melt the seed layer patterns 125 within an exposure time of several nanoseconds. Additionally, the energy of a laser beam employed to laser irradiate the seed layer patterns 125 may be adjusted depending on the thickness of the seed layer patterns 125. Furthermore, selection of a laser beam to employ in the laser irradiation process may depend on the material of the seed layer patterns 125. For example, the energy of a laser selected for the laser irradiation process may typically be more than about 1410° C. when the seed layer patterns 125 are amorphous silicon. Since the laser beam irradiation of the seed layer patterns 125 is performed in a short period of time, resulting heat stress on other structural materials is typically negligible. As one particular example, an Excimer laser may be employed to laser irradiate the seed layer patterns 125 in a short period of time.

Furthermore, as part of the laser irradiation process, in order to reduce the temperature gradient of the seed layer patterns 125 where the phase transition occurs during the seed layer pattern 125 transformation into a liquid phase, the semiconductor substrate 100 may be heated to the temperature of about 200° C. to about 600° C. By heating the semiconductor substrate 100, single-crystallized seed layer patterns 140 having dense and large grains may be formed.

As described above, the single-crystallized seed layer patterns 140 may be formed by laser irradiating the seed layer patterns 125 to induce LEG in the seed layer patterns 125. As a result, one or more silicon fins of a Fin-FET may be formed from the single-crystallized seed layer patterns 140 without etching the semiconductor substrate 100. In this embodiment, because fin surface damage that may result from etching is reduced or eliminated, the electrical characteristics of a resulting Fin-FET may be improved.

Furthermore, in order to increase the effective channel width of a Fin-FET, multiple fins may be formed without using auxiliary patterns, whereas in conventional methods the multiple fins are formed using the auxiliary patterns. As a result, the process to form multiple silicon fins may be simplified. Additionally, because a fine-quality single-crystal active pattern, that is, the single crystal multiple fin, may be formed by using a simple process such as the LEG process, on current characteristics of a Fin-FET may be increased.

Figure 8:
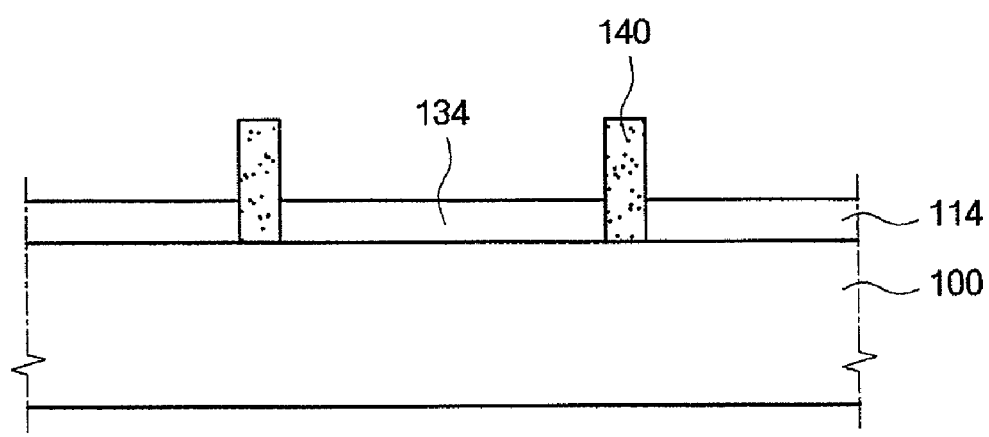

In FIG. 8, after the single-crystallized seed layer patterns 140 are formed, the first dielectric layer pattern 112 and the second dielectric layer pattern 132 are recessed by employing one or more removal processes. For example, the first dielectric layer pattern 112 and the second dielectric layer pattern 132 may be recessed by performing a wet etching process to form a first recessed dielectric layer pattern 114 and a second recessed dielectric layer pattern 134 on opposite sides of the single-crystallized seed layer patterns 140. The first recessed dielectric layer pattern 114 and a second recessed dielectric layer pattern 134 may function as a device isolation layer. After formation of first recessed dielectric layer pattern 114 and a second recessed dielectric layer pattern 134, the single-crystallized seed layer patterns 140 may protrude from the surface of the first recessed dielectric layer pattern 114 and the second recessed dielectric layer pattern 134.

Figure 9:
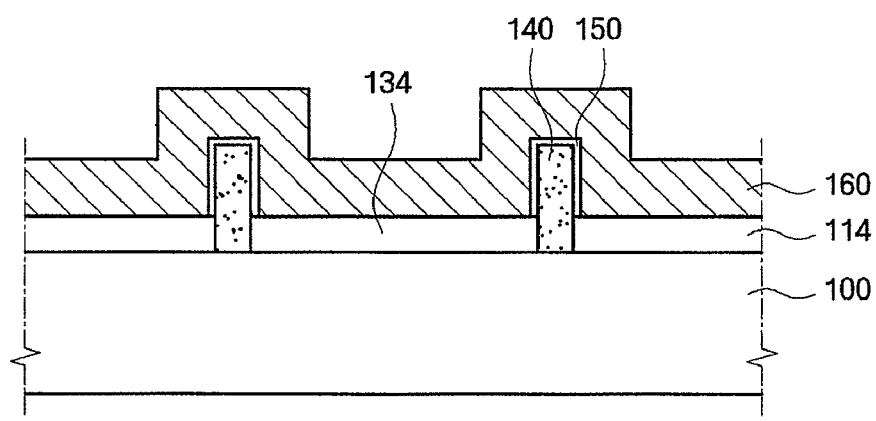

In FIG. 9, a gate dielectric layer 150 is formed on both sides and on top of the exposed surfaces of the single-crystallized seed layer patterns 140. For example, the gate dielectric layer 150 may be formed from a single layer of $SiO_2$, $Si_3N_4$, SiON, $Ge_xO_yN_z$, $Ge_xSi_yO_z$, high-k material, or may be formed in multiple layers by combining these materials, as just a few examples, although the scope of the present invention is not so limited.

A gate electrode 160 may be formed on the gate dielectric layer 150 such as to wrap and/or cross over the single-crystallized seed layer patterns 140. The gate electrode 160 may be formed in a single layer with doped polysilicon, metal materials such as W, Pt, Ru, and Ir, conductive metal nitride such as TiN, TaN, and WN, or conductive metal oxide such as RuO$_2$ and IrO$_2$. Furthermore, the gate electrode 160 may also be formed in multiple layers consisting of combinations of these materials. However, again, the scope of the present invention is not so limited.

When formed, the contact area between the gate electrode 160 and the single-crystallized seed layer patterns 140 via the gate dielectric layer 150 may function as the fin of a Fin-FET, and furthermore a channel is formed on both sides and on top of the single-crystallized seed layer patterns 140. Additionally, a semiconductor device based on the exemplary embodiment of the present invention may be formed by the formation of impurity regions in the single-crystallized seed layer patterns 140. For example, impurity doping regions may be formed by implanting impurities into the single-crystallized seed layer patterns 140 on both sides of the gate electrode 160.

FIGS. 10 and 11 are perspective views illustrating semiconductor integrated circuit devices fabricated by the methods described above. Such semiconductor integrated circuit devices may have different configurations of single-crystallized seed layer patterns 140, and the configurations may be determined, at least in part, on the configuration of a first dielectric layer pattern, such as the first dielectric layer pattern 112 illustrated in FIG. 2.

Referring to FIG. 10, a semiconductor integrated circuit device in accordance with an embodiment is illustrated. The semiconductor integrated circuit device of FIG. 10 may be fabricated by forming an open region inside the first dielectric layer pattern 112 during the formation of the first dielectric layer pattern 112 of FIG. 2 to form single-crystallized seed layer pattern 140 in the configuration as illustrated.

The semiconductor integrated circuit device illustrated in FIG. 10 may include a structure wherein two gate electrodes 160 cross over on the closed curve-shaped single-crystallized seed layer pattern 140. A gate dielectric layer 150 is formed on a contact area between the single-crystallized seed layer pattern 140 and the gate electrode 160. The single-crystallized seed layer pattern 140 may be formed by performing a LEG process on a seed layer pattern (refer to 125 of FIG. 6) including an amorphous or single-crystal thin film. Thus, as stated previously, the resulting single-crystallized seed layer pattern 140 may have no surface damage, and may furthermore consist of dense and large grains.

The single-crystallized seed layer pattern 140 may be divided into 4 sections. Because the gate electrode 160 is formed to wrap and cross the sides and the top of the single-crystal active pattern, one gate electrode 160 crosses the single-crystallized seed layer pattern 140 twice. As a result, one transistor may have two channel regions. This may result in increasing the width of the transistor active region as well as increasing the current characteristics of the semiconductor device.

In FIG. 11, a semiconductor integrated circuit device in accordance with another embodiment is illustrated. The semiconductor integrated circuit device of FIG. 11 may be fabricated by forming a line-shaped first dielectric layer pattern 112 during the forming of the first dielectric layer pattern 112 shown in FIG. 2 to form single-crystallized seed layer patterns 140 in the configuration as illustrated. The semiconductor device illustrated in FIG. 11 includes plural line-shaped, single-crystal active patterns 240 and one gate electrode 260 which crosses on predetermined areas of plural single-crystal active patterns 240 and wraps on both sides and top of the single-crystal active patterns 240. A gate dielectric layer 250 is formed on a contact area between the single-crystallized seed layer patterns 140 and the gate electrode 160. Thus, a transistor channel region is formed on both sides and on top of the single-crystallized seed layer 240 which contacts the gate electrode 260.

The single-crystallized seed layer 240 may be single-crystallized by forming a line-shaped seed layer pattern (refer to 125 of FIG. 6) followed by performing a LEG process. The single-crystallized seed layer 240 is formed without an etching process. Thus, as stated previously, the resulting single-crystallized seed layer patterns 140 may have no surface damage, and may furthermore consist of dense and large grains. As a result, the electrical characteristics of the Fin-FET may be improved.

While the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

As described above, according to the fabrication method of the semiconductor integrated circuit device based on the present invention and the semiconductor integrated circuit device fabricated by such method set forth herein, because the semiconductor substrate is not etched to form the active pattern of the Fin-FET, the single-crystallized seed layer may be formed without surface damage.

Additionally, the active pattern is formed by forming an amorphous or polycrystalline seed layer followed by a LEG process. Employing a process such as this may enable a single-crystallized seed layer consisting of dense and large size grains to be formed.

Additionally, high quality fins may be formed without using additional patterns to form multiple fins where the Fin-FET channel is formed. As a result, the semiconductor having a Fin-FET with improved electrical characteristics may be fabricated.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A semiconductor integrated circuit device, comprising:
   a semiconductor substrate having a top surface and a bottom surface;
   a single-crystal seed layer protruding from the top surface of the semiconductor substrate;
   a gate dielectric layer formed on both sides and top of the single-crystal seed layer; and
   a gate electrode formed on the single-crystal seed layer and the gate dielectric layer.
2. The semiconductor integrated circuit device as claimed in claim 1, wherein the single-crystal seed layer comprises a thin film including silicon, germanium, or compounds thereof.
3. The semiconductor integrated circuit device as claimed in claim 2, wherein the single-crystal seed layer comprises an amorphous silicon layer or a polysilicon layer.

4. The semiconductor integrated circuit device as claimed in claim 1, wherein the single-crystal seed layer has a closed curve shape.

5. The semiconductor integrated circuit device as claimed in claim 1, wherein the single-crystal seed layer has a line shape.

* * * * *